(12) United States Patent
Sun et al.

(10) Patent No.: US 10,720,564 B2
(45) Date of Patent: Jul. 21, 2020

(54) MAGNETOELECTRIC VERY LOW FREQUENCY COMMUNICATION SYSTEM

(71) Applicant: Northeastern University, Boston, MA (US)

(72) Inventors: Nian Xiang Sun, Winchester, MA (US); Menghui Li, Medford, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 16/344,636

(22) PCT Filed: Oct. 25, 2017

(86) PCT No.: PCT/US2017/058377
§ 371 (c)(1),
(2) Date: Apr. 24, 2019

(87) PCT Pub. No.: WO2018/081324
PCT Pub. Date: May 3, 2018

(65) Prior Publication Data
US 2019/0267534 A1 Aug. 29, 2019

Related U.S. Application Data

(60) Provisional application No. 62/412,467, filed on Oct. 25, 2016.

(51) Int. Cl.
*H04W 56/00* (2009.01)
*H01L 41/06* (2006.01)
(Continued)

(52) U.S. Cl.
CPC ............ *H01L 41/06* (2013.01); *H01L 41/047* (2013.01); *H01L 41/082* (2013.01); *H01L 41/09* (2013.01); *H01L 41/12* (2013.01); *H01L 41/18* (2013.01); *H01L 41/183* (2013.01); *H01L 41/20* (2013.01); *H01L 41/22* (2013.01); *H04B 1/38* (2013.01)

(58) Field of Classification Search
CPC ..... H04L 41/06; H04L 41/047; H04L 41/082; H04L 41/09; H04L 41/12; H04L 41/18; H04L 41/183; H04L 41/20; H04L 41/22; H04B 1/38
See application file for complete search history.

(56) References Cited

U.S. PATENT DOCUMENTS 5,854,589 A * 12/1998 How ................... G08B 13/2408
340/551
2012/0050236 A1* 3/2012 Lo ........................ H03H 9/0095
345/204

(Continued)

*Primary Examiner* — Sai Ming Chan
(74) *Attorney, Agent, or Firm* — Verrill Dana, LLP

(57) ABSTRACT

Compact and power efficient acoustically actuated magnetoelectric antennas for transmitting and receiving very low frequency (VLF) electromagnetic waves utilize magnetoelectric coupling in a magnetic/piezoelectric heterostructure to provide voltage control of magnetization in transmission mode and magnetic control of electric polarization in receiving mode. The magnetoelectric antennas provide a power efficiency enhanced by orders of magnitude compared to magnetically or mechanically switching the magnetization. The antennas can be used in groups or arrays and can be combined to form VLF communication systems.

26 Claims, 4 Drawing Sheets

(51) Int. Cl.
*H01L 41/047* (2006.01)
*H01L 41/08* (2006.01)
*H01L 41/09* (2006.01)
*H01L 41/12* (2006.01)
*H01L 41/18* (2006.01)
*H01L 41/20* (2006.01)
*H04B 1/38* (2015.01)
*H01L 41/22* (2013.01)

(56) References Cited

U.S. PATENT DOCUMENTS

2013/0099179 A1* 4/2013 Vanheusden ............. H01B 1/22
  252/514
2016/0172578 A1* 6/2016 Valbin ................... H01L 41/047
  600/508

* cited by examiner

MAGNETOELECTRIC VERY LOW FREQUENCY COMMUNICATION SYSTEM

CROSS-REFERENCE TO RELATED APPLICATIONS

This application claims the priority of U.S. Provisional Application No. 62/412,467 filed Oct. 25, 2016, entitled "Power Efficient and Ultra-Compact Magnetoelectric VLF Communication System with Direct Modulation of Magnetoelectric Antennas", which is hereby incorporated by reference in its entirety.

BACKGROUND

Displacing magnetic charges or hard magnets mechanically generates varying electromagnetic fields, which can provide a means for transmitting very low frequency (VLF) electromagnetic waves. VLF electromagnetic waves have a frequency from 3 to 30 kHz, which corresponds to wavelengths from 100 km to 10 km. VLF electromagnetic radiation has found use in long distance communication, for example communication with submarines. Mechanically displacing hard magnets for radiating electromagnetic waves presents several challenges, such as extremely low radiation efficiency due to energy losses resulting from large frictional forces. In particular, achieving a high linear or angular velocity at 10 kHz or above is challenging due to the limited angular speed achieved by mechanical motors.

Typically, an antenna receives information in the form of electromagnetic waves, whereby electrons in the antenna are pushed by the electric field, leading to the production of oscillating voltage and current. To receive and transmit an electromagnetic wave, the length of the antenna has to roughly match a fraction of the wavelength of the electromagnetic wave (e.g., ½ or ¼$^{th}$ of the wavelength). The common half-wave dipole antenna consists of two quarter-wavelength antenna elements arranged end to end, each connected to a transmission line. Because of the dependence of the antenna size on wavelength, a full size antenna capable of transmitting VLF waves (3 kHz to 30 kHz) would need to be very large. In general, however, the length of a VLF transmitting antenna is only a small fraction of the length of the VLF wave. Such an antenna radiates only a fraction of the transmitter power. Also, long distance communication requires the use of high power transmitters.

There is a need for compact, mobile, and power efficient VLF magnetoelectric antennas for use in communication systems.

SUMMARY

The present technology provides power efficient, compact, and mobile magnetoelectric antennas that operate in the very low frequency (VLF) range, and communication systems based on the antennas. The VLF antennas include a piezoelectric core that acts as an acoustic actuator in contact with and acting upon metallic glass foils encasing the core, which receive and transmit VLF electromagnetic waves.

In one aspect, the present technology provides a magnetoelectric antenna for transmitting and receiving VLF electromagnetic waves. The antenna includes a thin film heterostructure having an essentially planar piezoelectric core composite sandwiched between metallic glass foils. The piezoelectric core composite includes a piezoelectric material having a first surface in contact with a first film and a second surface in contact with a second film. At least one of the first and second films includes a first pair of interdigitated electrodes. The heterostructure is capable of resonating in the VLF range (from about 3 kHz to about 30 kHz). The antenna is such that, in a transmission mode, oscillating mechanical strain produced in the piezoelectric material by an AC voltage applied to the first pair of electrodes is transferred to the magnetic glass foils through strain-mediated magnetoelectric coupling. This leads to magnetization oscillation in the glass foil material and consequent radiation of the VLF electromagnetic waves. In a receiving mode, the heterostructure senses magnetic components of VLF electromagnetic waves arriving at the antenna and, in concert with the core, produces a piezoelectric output voltage.

Embodiments of the above magnetoelectric antenna can include one or more of the following features. In one embodiment the second film includes a second pair of interdigitated electrodes. In one embodiment, first pair of interdigitated electrodes is capable of providing opposite polarity compared with the second pair of interdigitated electrodes. In certain embodiments, the first and second pairs of interdigitated electrodes are aligned. In one embodiment, the metallic glass foils includes extensions at opposite ends of the heterostructure, each extension including a bilayer of the metallic glass foils and extending beyond the piezoelectric core composite. In one embodiment, each metallic glass foil includes multiple layers of metallic glass sheets. The antenna can have a length (including the extensions) from about 10 mm to about 125 mm, a width from about 0.5 mm to about 15 mm, and a thickness from about 0.1 mm to about 0.3 mm. The aspect ratio of the antenna (length to width ratio) can be in the range of about 5 to about 15. For example, the aspect ratio is within the range 6-14, 7-13, 8-12, 9-11, 5-8, 7-10, 9-12, 11-14, 13-15, 5-6, 6-7, 7-8. 8-9. 9-10 10-11, 11-12, 12-13, 13-14, or 14-15. The length of the heterostructure (i.e., the antenna excluding the metallic glass extensions) can be from about 20 mm to about 80 mm. Each of the extensions can have a length from about 5 mm to about 60 mm. In an exemplary embodiment, the output voltage in receiving mode at an electromechanical resonance frequency of 23.7 Hz and a magnetic field excitation of 12 nT is at least 60 µV. In an embodiment, the impedance at the resonance frequency of the heterostructure is from about 5 to about 60 kOhm. The piezoelectric material of the antenna can be any one of the following materials: aluminum nitride, lithium niobate, lithium tantalate, zinc oxide, gallium nitride, quartz, and lead zirconate titanate. The magnetic glass can be an alloy having one or more nonmetals selected from the group consisting of Si, B, and P and one or more metals selected from the group consisting of Fe, Co, Ni, and Mo. In an embodiment, the magnetoelectric antenna has a sensitivity of about 72.2 V/Oe or greater. In an embodiment, the limit of detection is 0.138 pT or less.

In another aspect, the present technology provides a magnetoelectric antenna array that includes a plurality of magnetoelectric antennas according to any one the embodiments above, wherein the antennas are capable of synchronous operation through mechanical coupling.

In yet another aspect, provided herein is a magnetoelectric communication system including first and second magnetoelectric antennas according to any one of the embodiments above. The first and second antennas are separated by a distance, and the first antenna functions as a transmitter of VLF electromagnetic waves of a selected wavelength while the second antenna functions as a receiver of VLF electromagnetic waves of the same wavelength. In an embodiment, the magnetoelectric communication system further includes a power amplifier to power the first magnetoelectric antenna.

In an exemplary embodiment, the system is capable of transmitting and receiving electromagnetic waves with the first and second antennas separated by at least 560 feet and with the first antenna powered by no more than 1 watt.

In still another aspect, a magnetoelectric communication system including first and second magnetoelectric antenna arrays as described above is provided. The first and the second antenna arrays are separated by a distance and while the first antenna array functions as a transmitter of VLF electromagnetic waves of a selected wavelength, the second antenna array functions as a receiver of VLF electromagnetic waves of the same wavelength. In one embodiment, the magnetoelectric communication system further includes a power amplifier to power the first magnetoelectric antenna.

The technology presented herein can be further summarized with the following list of embodiments.

1. A magnetoelectric antenna for transmitting and receiving very low frequency electromagnetic waves, the antenna comprising a thin film heterostructure comprising:
   an essentially planar piezoelectric core composite comprising:
      a layer of piezoelectric material having a first surface and a second surface;
      a first nonconductive film in contact with the first surface;
      a second nonconductive film in contact with the second surface; and
      a first pair of interdigitated electrodes deposited on the first film; and
   two essentially planar metallic glass foils enveloping the piezoelectric core composite and extending beyond the piezoelectric core composite to form extensions extending beyond the piezoelectric core composite, wherein each extension comprises a bilayer of the metallic glass foils;
   wherein the heterostructure is capable of resonating at a very low frequency in the range from about 3 kHz to about 30 kHz;
   wherein in a transmission mode, oscillating mechanical strain produced in the piezoelectric material by an AC voltage applied to the first pair of electrodes is transferred to the magnetic glass foils through strain-mediated magnetoelectric coupling, leading to magnetization oscillation that radiates electromagnetic waves at said very low frequency; and
   wherein in a receiving mode, the heterostructure senses magnetic components of electromagnetic waves of said very low frequency arriving at the antenna, converting the magnetic components into a piezoelectric voltage output.

2. The magnetoelectric antenna of embodiment 1, wherein the second film comprises a second pair of interdigitated electrodes.

3. The magnetoelectric antenna of embodiment 2, wherein the first and second pairs of interdigitated electrodes are aligned.

4. The magnetoelectric antenna of any of the previous embodiments, wherein the metallic glass foils, including the extensions, have an overall aspect ratio in the range from about 8 to 12.

5. The magnetoelectric antenna of any of the previous embodiments, wherein the heterostructure has an overall length from about 10 mm to about 125 mm.

6. The magnetoelectric antenna of any of the previous embodiments, wherein the heterostructure has a length from about 20 mm to about 80 mm.

7. The magnetoelectric antenna of any of the previous embodiments, wherein the impedance at the resonance frequency of the heterostructure is from about 5 to about 60 kOhm.

8. The magnetoelectric antenna of any of the previous embodiments having a sensitivity of about 72.2 V/Oe or greater.

9. The magnetoelectric antenna of any of the previous embodiments having limit of detection of about 0.138 pT or less.

10. The magnetoelectric antenna of any of the previous embodiments, wherein the piezoelectric material is selected from the group consisting of aluminum nitride, lithium niobate, lithium tantalate, zinc oxide, gallium nitride, quartz, and lead zirconate titanate.

11. The magnetoelectric antenna of any of the previous embodiments, wherein the magnetic glass comprises an alloy having one or more nonmetals selected from the group consisting of Si, B, and P and one or more metals selected from the group consisting of Fe, Co, Ni, and Mo.

12. A communication device comprising the magnetoelectric antenna of any of the previous embodiments.

13. A magnetoelectric antenna array comprising a plurality of magnetoelectric antennas of any of embodiments 1-11, capable of being synchronously operated through mechanical coupling.

14. The antenna array of embodiment 13, wherein the plurality of antennas are tuned to the same wavelength or different wavelengths.

15. A communication device comprising the magnetoelectric antenna array of embodiment 13 or embodiment 14.

16. A magnetoelectric communication system comprising first and second magnetoelectric antennas of any of embodiments 1-11, or the communication device of embodiment 12, the first and second antennas separated by a distance, wherein the first antenna functions as a transmitter of very low frequency electromagnetic waves of a selected wavelength and the second antenna functions as a receiver of very low frequency electromagnetic waves of the same wavelength.

17. The magnetoelectric communication system of embodiment 16, further comprising a power amplifier to power the first magnetoelectric antenna as a transmitter.

18. The magnetoelectric communication system of embodiment 16, wherein both the first and second antennas are configured to function alternately as a transmitter or a receiver.

19. The magnetoelectric communication system of embodiment 18, further comprising power amplifiers to power the first and second magnetoelectric antennas when used in transmission mode.

20. A magnetoelectric communication system comprising first and second magnetoelectric antenna arrays according to embodiment 13 or embodiment 14, or the communication device of embodiment 15, the first and second antenna arrays separated by a distance, wherein the first antenna array functions as a transmitter of very low frequency electromagnetic waves of a selected wavelength and the second antenna array functions as a receiver of very low frequency electromagnetic waves of the same wavelength.

21. The magnetoelectric communication system of embodiment 20, further comprising a power amplifier to power the first magnetic antenna array.

22. The magnetoelectric communication system of embodiment 20, wherein both the first and second antennas are configured to function alternately as a transmitter or a receiver.

23. The magnetoelectric communication system of embodiment 22, further comprising power amplifiers to power the first and second magnetoelectric antennas when used in transmission mode.

24. The magnetoelectric communication system of any of embodiments 16-23, wherein the system is capable of transmitting and receiving electromagnetic waves with the first and second antennas separated by at least 560 feet and with the first antenna powered by no more than about 1 watt.

25. The magnetoelectric communication system of any of embodiments 16 to 24, wherein the system is capable of operation by a plurality of mobile users.

26. A method of very low frequency (VLF) wireless communication, the method comprising:

(a) providing at least first and second communication devices according to embodiment 15, wherein the devices comprise antennas tuned to a selected frequency in the VLF range;

(b) transmitting a signal from the first device operating in transmission mode to the second device operating in receiving mode.

DETAILED DESCRIPTION

Figure 1A:
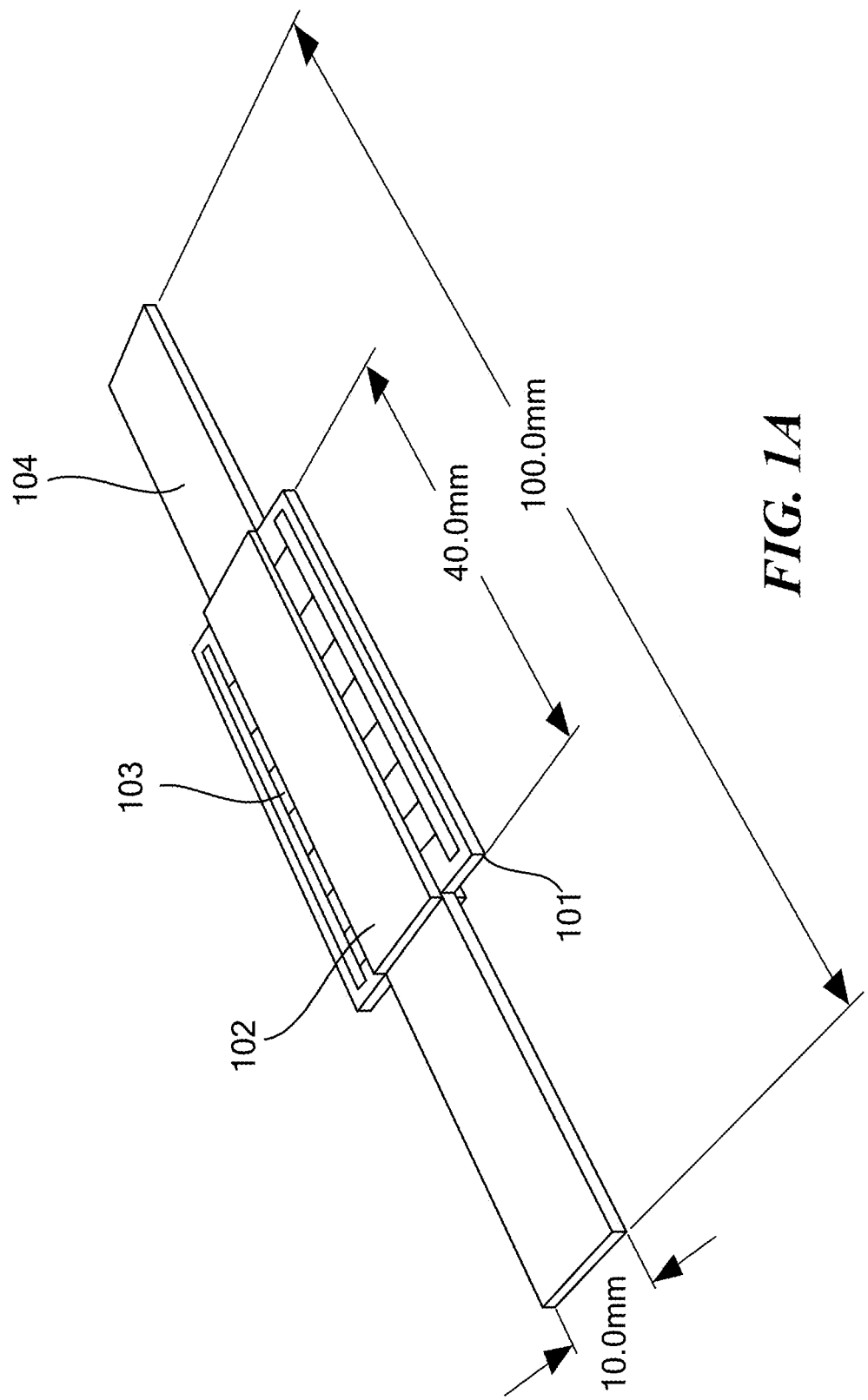
FIG. 1A shows a schematic representation of an embodiment of a magnetoelectric antenna/sensor comprising a PZT (lead zirconate titanate) core composite having interdigitated electrodes sandwiched between metallic glass foils.

The present technology provides compact and power efficient acoustically actuated magnetoelectric antennas for transmitting and receiving VLF electromagnetic waves. The technology utilizes the strong magnetoelectric coupling in a magnetic/piezoelectric heterostructure, which leads to voltage control of magnetization (in transmission mode) or magnetic control of electric polarization (in receiving mode). The present magnetoelectric antennas provide a power efficiency enhanced by orders of magnitude compared to magnetically or mechanically switching the magnetization. The antennas can be used in groups or arrays and can be paired or otherwise combined to form the basis for communication systems.

The antennas described herein comprise a thin film heterostructure that includes an essentially planar piezoelectric core composite sandwiched between metallic glass foils. The piezoelectric core comprises a piezoelectric material having a first surface and a second surface in contact respectively with first and second films, and serves as an actuator. At least one film of the core comprises a pair of interdigitated electrodes. In use, the interdigitated electrodes on a film are biased with opposite polarities. The heterostructure is capable of resonating at a frequency in the VLF range. In a transmission mode, oscillating mechanical strain produced in the piezoelectric material by an AC voltage applied to the electrodes is transferred to the magnetic glass foils through strain-mediated magnetoelectric coupling. This results in magnetization oscillation and radiation of VLF electromagnetic waves. On the other hand, in a receiving mode, the heterostructure senses magnetic components of the VLF electromagnetic waves arriving at the antenna, converting the magnetic components into a piezoelectric voltage output. The metallic glass foils comprise extensions at opposite ends of the heterostructure Each extension comprises a bilayer of the metallic glass foils and extends beyond the piezoelectric core composite.

The piezoelectric core can include or consist of any piezoelectric material, such as, for example, aluminum nitride, lithium niobate, lithium tantalate, zinc oxide, gallium nitride, quartz, and a lead zirconate titanate (PZT) material. The magnetic glass can be an alloy comprising one or more nonmetals, such as one or more selected from Si, B, and P, together with one or more metals, such as one or more selected from Fe, Co, Ni, and Mo.

The magnetoelectric antenna can further comprise a second film in contact with the second surface of the piezoelectric material opposite the first surface. The second film can optionally also include a pair of interdigitated electrodes. Similar to the interdigitated electrodes in the first film, adjacent electrodes in the second film will have opposite polarities when the antenna is in operation.

The piezoelectric core composite can be designed as described for any of the piezoelectric core composites described in U.S. Pat. No. 6,629,341 (incorporated herein by reference in its entirety). In this case, the piezoelectric material is a macro-fiber capable of a piezoelectric response and acoustic transduction in the VLF range. The first and the second surfaces of the piezoelectric material are adhesively bonded to the first and the second films, respectively. The first and the second films can be fabricated from any type of electrically non-conducting material, such as a polyimide (e.g., KAPTON). First and second conductive patterns forming the electrodes are formed on the first film. Each conductive pattern is electrically isolated from the other (e.g., through a gap of nonconductive material) and in electrical contact with the piezoelectric material. In one embodiment, the second film does not have any conductive pattern. The electrodes of first and second conductive patterns of the first film combined form a pattern of interdigitated electrodes.

In one embodiment, the piezoelectric material is a macro-fiber comprising a plurality of piezoelectric fibers in juxtaposition. Each fiber has a first side and a second side (corresponding to the first and second surface, respectively, of the piezoelectric material) and each pair of adjacent fibers is separated by a channel. A first adhesive layer is disposed over the first sides of the fibers and in the channel. Further, a first film is bonded to the first sides of the fibers. The first film further includes a first and a second conductive pattern formed thereon, the first conductive pattern being electrically isolated from the second conductive pattern. Both conductive patterns are in electrical contact with the piezoelectric material. Each of the first and second conductive patterns has a plurality of electrodes that cooperate to form a pattern of interdigitated electrodes. Further, a second adhesive layer is disposed over the second sides of the fibers and into the channels, and a second film is bonded to the second sides of the fibers. Similar to the first film, the second film too has a first conductive pattern and additionally, a second conductive pattern, electrically isolated from the first conductive pattern. Each of the first and second conductive patterns of the second film has a plurality of electrodes that together form a pattern of interdigitated electrodes and each of the patterns is in electrical contact with the fibers.

In the above embodiments, each of the first film and the second film has a longitudinally extending axis and a plurality of piezoelectric fibers of the piezoelectric material extend in the direction of the longitudinal axes of the films. Further, each interdigitated electrode of the first and second conductive patterns extends in a direction that is substantially perpendicular to the longitudinal axes of the films and substantially perpendicular to the longitudinal direction of the piezoelectric fibers. In addition to the interdigitated electrodes, each conductive pattern comprises a longitudinally extending portion to which each of the interdigitated electrodes is connected. The first and the second film, each has width and length dimensions that are larger than the width and length of piezoelectric material. This allows the placement of longitudinally extending portions of the conductive patterns away from the piezoelectric material. This configuration significantly reduces the potential for cracking of macro-fibers caused by highly non-uniform electrical field distribution in regions beneath and adjacent to the longitudinally extending portions. The conductive patterns of the first film are in a "mirror-image" alignment with the conductive patterns of the second film across the thickness of macro-fibers.

In one embodiment, the piezoelectric core composite is assembled in accordance with methods described in U.S. Pat. No. 6,629,341. The method requires providing a structure comprising a monolithic piezoelectric material having a first side and a second side. The monolithic piezoelectric material can be a ferro-electric wafer fabricated from an unelectroded, piezoelectric material. For example, the wafer can be fabricated using a PZT-5 piezoelectric ceramic material. Any piezo-electric material may be used, however, to fabricate the wafer. Preferably, the piezoelectric wafer has a thickness between about 0.002 and 0.010 inches. The method further requires providing a backing sheet having an adhesive side and positioning the structure comprising the monolithic piezoelectric material on the backing sheet such that the first side of the structure is attached to the adhesive side of the backing sheet. Cutting through the structure positioned on the backing sheet provides a plurality of piezoelectric fibers in juxtaposition, the plurality of piezoelectric fibers having first and second sides that correspond, respectively, to the first and second surfaces of the piezoelectric material (wafer). A second film is bonded to the second side of the plurality of piezoelectric fibers. The backing sheet is peeled away from the first side of the plurality of piezoelectric fibers and the first film is bonded to the first side of the plurality of piezoelectric fibers. This film has a first conductive pattern and a second conductive pattern formed on it and these conductive patterns electrically contact the plurality of piezoelectric fibers. As noted above, the first conductive pattern is electrically isolated from the second conductive pattern and the first and second conductive patterns each have a plurality of electrodes. Together, the electrodes cooperate to form a pattern of interdigitated electrodes. The conductive patterns may be formed using a photoresist-and-etch process and pre-bonded polyimide-copper sheet laminate (e.g. Dupont Pyralux® copper clad laminates). The preferred thickness of the copper sheet material is between about 0.0005 and 0.001 inches. Materials other than copper sheet, e.g. gold, silver, etc. also can be used for fabricating the conductive patterns.

The magnetoelectric antenna described herein may have any dimensions required for transmitting and receiving VLF electromagnetic radiation. For example, it can have the following dimensions: length from about 10 mm to about 125 mm, width from about 5 mm to about 15 mm, and thickness from about 0.1 mm to about 0.3 mm. FIG. 1A shows a schematic representation of an embodiment of a magnetoelectric antenna constructed in accordance with the present technology. The antenna has a PZT core composite 101 sandwiched between two metallic glass foils 102. The dimensions of the antenna embodiment are as shown in the figure. The core composite has interdigitated electrodes 103 and the metallic glass foils are extended from both ends of the core composite to provide extensions 104. The impedance of this antenna at the electromechanical resonance frequency is in the range of 5 to 60 kOhm (FIG. 1B) and the output voltage at the electromechanical resonance with a 0.12 nT AC magnetic field excitation is 86.65 µV.

A plurality of magnetoelectric antennas described above, synchronously operated through mechanical coupling, can be assembled into an array.

Further, multiple magnetoelectric antennas, or arrays of magnetic antennas can be combined together to form a magnetoelectric communication system. In its simplest form, the communication system can include two antennas separated by a distance, which function as a transmitting/receiving pair, each unit capable of both transmitting and receiving; the pair can also be configured so that one transmits and the other receives. See exemplary embodiment in FIG. 2A. In this system, the two antennas are separated by a distance of 80 feet. One antenna (left) functions as a transmitter of VLF electromagnetic waves of a selected wavelength and the other antenna functions as a receiver of VLF electromagnetic waves of same wavelength. Because of the compact size of each antenna, they can be readily moved, allowing one to set up a communication system among mobile, roaming users in any environment or location. A communication system may be made also of two magnetoelectric antenna arrays. Antennas in an array can be grouped such that each group of antennas operates at a frequency that is different from the frequency under which other groups operate. A communication system can also operate with each unit capable of switching among different frequencies or channels, so as to avoid interference from other transmissions. Further, a communication system may be so designed such that an antenna receiving a VLF signal can retransmit that signal either on its own or through another antenna operating in conjunction with it. In this manner, the communication system may be scaled up so as to make communication possible over larger distances.

EXAMPLES

Example 1: Magnetoelectric Antenna

Figures 1B, 1C:
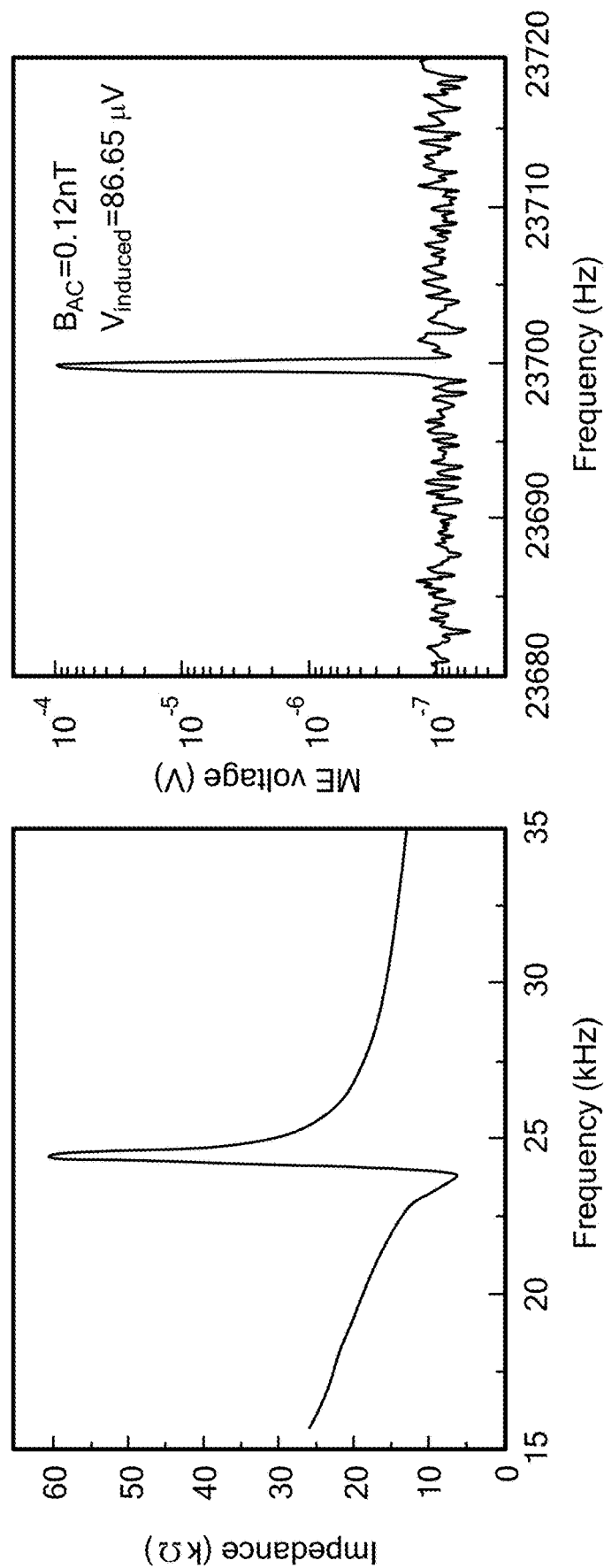
FIG. 1B shows the impedance measure of the antenna shown in FIG. 1A. The impedance is in the range of 5 to 60 kOhm near the electromechanical resonance of the antenna.
FIG. 1C shows the magnitude of output voltage produced by the magnetoelectric antenna shown in FIG. 1A. The antenna was subjected to a magnetic field excitation of 0.12 nT and the output voltage was measured at the electromechanical resonance.

A magnetoelectric antenna (or sensor) made of a PZT core composite having interdigitated electrodes sandwiched between metallic glass foils was constructed (FIGS. 1A-1C). The antenna was observed to have impedance in the range of 5 to 60 kOhm near the electromechanical resonance frequency, 23.7 kHz, of the antenna. The electromechanical resonance frequency of the antenna can be adjusted through changes to the design in order to achieve improved impedance matching. The antenna showed a peak output voltage, $V_{rms}$, of 86.65 µV at the electromechanical resonance under a magnetic field excitation of 0.12 nT AC. The electronic noise floor was observed to be 0.1 µV. The sensitivity and the limit of detection (LOD) of the magnetoelectric sensor were calculated as shown below:

$$\text{Sensitivity} = \frac{86.65 \text{ }\mu V}{0.12 \text{ }nT} = 72.2 \text{ V/Oe}$$

$$LOD = \frac{\text{noise level}}{\text{sensitivity}} = \frac{100 \text{ }nV_{rms}}{72.2 \text{ V/Oe}} = 1.38 \times 10^{-13} T = 0.138 \text{ }pT.$$

Example 2: Magnetoelectric Communication System

Figure 2A:
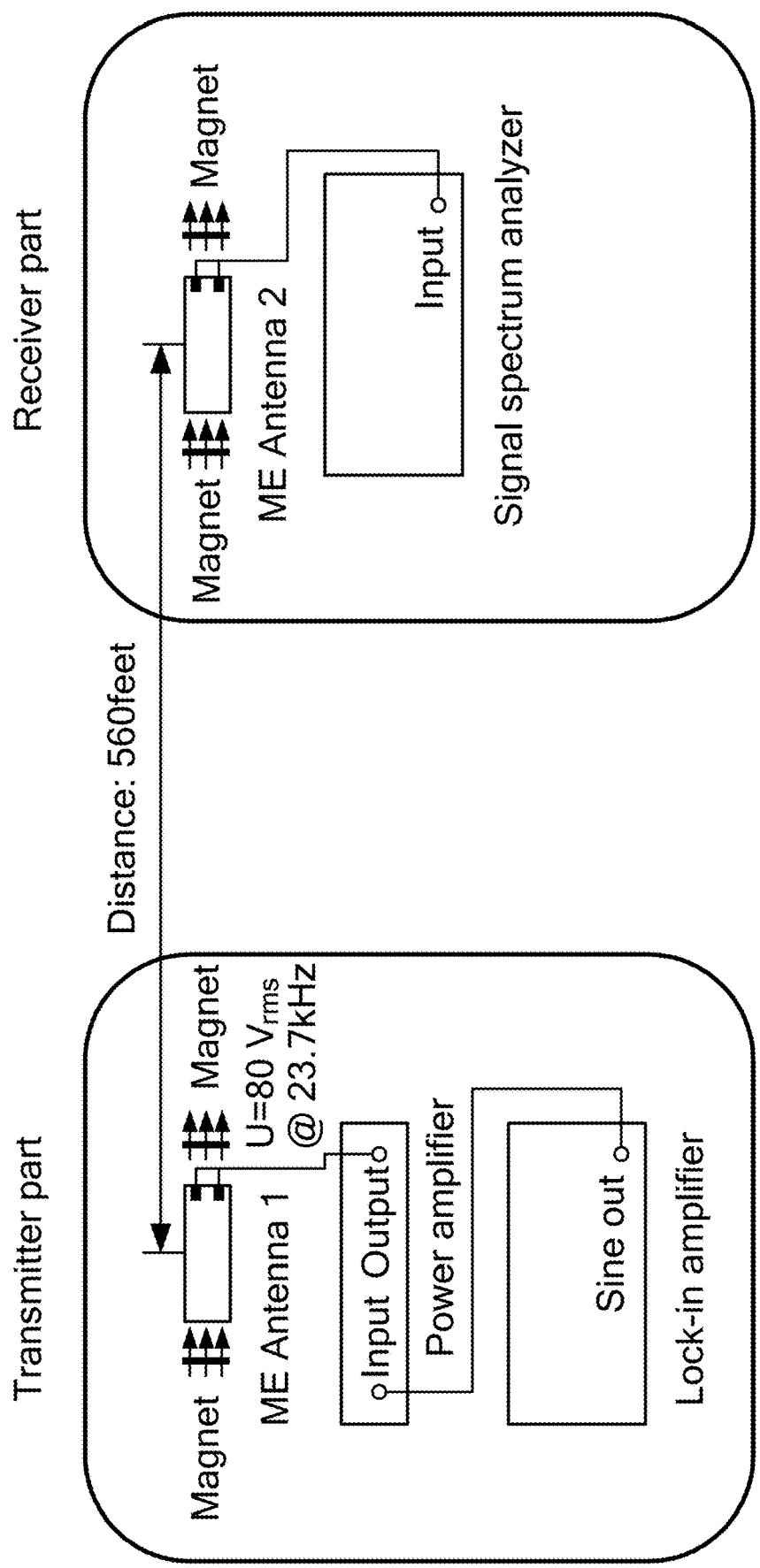
FIG. 2A is a schematic diagram of a magnetoelectric communication system having two magnetoelectric antennas that are 80 cm apart, one driven by a power amplifier and the other connected to a spectrum analyzer. Both antennas are magnetically biased by a small hard button magnet pair for achieving optimal performance.
Figure 2B:
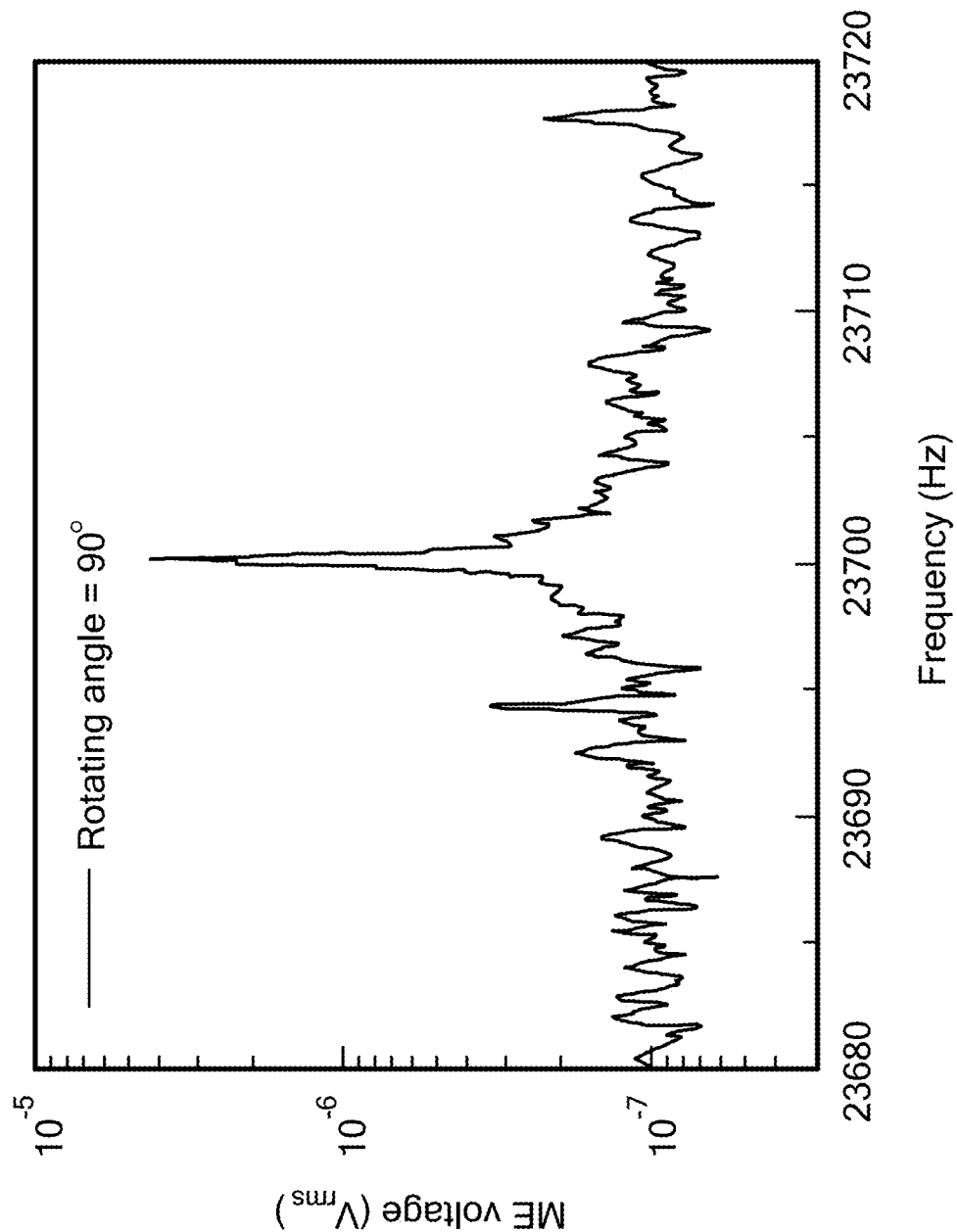
FIG. 2B shows the voltage output of the magnetoelectric antenna connected to the spectrum analyzer.

A magnetoelectric communication system was assembled using two antennas constructed according to Example 1 and placed 80 feet apart (FIG. 2A). One antenna was driven by a power amplifier (antenna #1) and the other connected to a signal spectrum analyzer (antenna #2). Each antenna was biased using a pair of small hard magnets for optimal performance. The transmitting antenna, i.e., antenna #1, was driven by 80 V rms AC voltage near 23.7 kHz. The magnetoelectric voltage output from the receiving antenna showed a peak $V_{rms}$ of about 50 µV with a noise voltage of 0.1 µV. The power delivered to magnetoelectric antenna #1 was estimated to be about 1 W. It was estimated that the antennas of the magnetoelectric communication system can communicate with a working frequency of 23.7 kHz and 0 dB signal to noise ratio when the antennas are 560 feet apart and the input power is 1 W.

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with "consisting essentially of" or "consisting of".

What is claimed is:

1. A magnetoelectric antenna for transmitting and receiving very low frequency electromagnetic waves, the antenna comprising a thin film heterostructure comprising:
    an essentially planar piezoelectric core composite comprising:
        a layer of piezoelectric material having a first surface and a second surface;
        a first nonconductive film in contact with the first surface;
        a second nonconductive film in contact with the second surface; and
        a first pair of interdigitated electrodes deposited on the first film; and
    two essentially planar metallic glass foils enveloping the piezoelectric core composite and extending beyond the piezoelectric core composite to form extensions extending beyond the piezoelectric core composite, wherein each extension comprises a bilayer of the metallic glass foils;
    wherein the heterostructure is capable of resonating at a very low frequency in the range from about 3 kHz to about 30 kHz;
    wherein in a transmission mode, oscillating mechanical strain produced in the piezoelectric material by an AC voltage applied to the first pair of electrodes is transferred to the magnetic glass foils through strain-mediated magnetoelectric coupling, leading to magnetization oscillation that radiates electromagnetic waves at said very low frequency; and
    wherein in a receiving mode, the heterostructure senses magnetic components of electromagnetic waves of said very low frequency arriving at the antenna, converting the magnetic components into a piezoelectric voltage output.

2. The magnetoelectric antenna of claim 1, wherein the second film comprises a second pair of interdigitated electrodes.

3. The magnetoelectric antenna of claim 2, wherein the first and second pairs of interdigitated electrodes are aligned.

4. The magnetoelectric antenna of claim 1, wherein the metallic glass foils, including the extensions, have an overall aspect ratio in the range from about 8 to about 12.

5. The magnetoelectric antenna of claim 4, wherein the heterostructure has an overall length from about 10 mm to about 125 mm.

6. The magnetoelectric antenna of claim 1, wherein the heterostructure has a length from about 20 mm to about 80 mm.

7. The magnetoelectric antenna of claim 1, wherein the impedance at the resonance frequency of the heterostructure is from about 5 to about 60 kOhm.

8. The magnetoelectric antenna of claim 1 having a sensitivity of about 72.2 V/Oe or greater.

9. The magnetoelectric antenna of claim 1 having limit of detection of about 0.138 pT or less.

10. The magnetoelectric antenna of claim 1, wherein the piezoelectric material is selected from the group consisting of aluminum nitride, lithium niobate, lithium tantalate, zinc oxide, gallium nitride, quartz, and lead zirconate titanate.

11. The magnetoelectric antenna of claim 1, wherein the magnetic glass comprises an alloy having one or more nonmetals selected from the group consisting of Si, B, and P and one or more metals selected from the group consisting of Fe, Co, Ni, and Mo.

12. A communication device comprising the magnetoelectric antenna of claim 1.

13. A magnetoelectric antenna array comprising a plurality of magnetoelectric antennas of claim 1, capable of being synchronously operated through mechanical coupling.

14. The antenna array of claim 13, wherein the plurality of antennas are tuned to the same wavelength or different wavelengths.

15. A communication device comprising the magnetoelectric antenna array of claim 13.

16. A magnetoelectric communication system comprising first and second magnetoelectric antennas of claim 1, the first and second antennas separated by a distance, wherein the first antenna functions as a transmitter of very low frequency electromagnetic waves of a selected wavelength and the second antenna functions as a receiver of very low frequency electromagnetic waves of the same wavelength.

17. The magnetoelectric communication system of claim 16, further comprising a power amplifier to power the first magnetoelectric antenna.

18. The magnetoelectric communication system of claim 16, wherein both the first and second antennas are configured to function alternately as a transmitter or a receiver.

19. The magnetoelectric communication system of claim 18, further comprising power amplifiers to power the first and second magnetoelectric antennas when used in transmission mode.

20. A magnetoelectric communication system comprising first and second magnetoelectric antenna arrays according to claim 13, the first and second antenna arrays separated by a distance, wherein the first antenna array functions as a transmitter of very low frequency electromagnetic waves of a selected wavelength and the second antenna array functions as a receiver of very low frequency electromagnetic waves of the same wavelength.

21. The magnetoelectric communication system of claim 20, further comprising a power amplifier to power the first magnetic antenna array.

22. The magnetoelectric communication system of claim 20, wherein both the first and second antennas are configured to function alternately as a transmitter or a receiver.

23. The magnetoelectric communication system of claim 22, further comprising power amplifiers to power the first and second magnetoelectric antennas when used in transmission mode.

24. The magnetoelectric communication system of claim 16, wherein the system is capable of transmitting and receiving electromagnetic waves with the first and second antennas separated by at least 560 feet and with the first antenna powered by no more than about 1 watt.

25. The magnetoelectric communication system of claim 16, wherein the system is capable of operation by a plurality of mobile users.

26. A method of very low frequency (VLF) wireless communication, the method comprising:
  (a) providing at least first and second communication devices according to claim 15, wherein the devices comprise antennas tuned to a selected frequency in the VLF range;
  (b) transmitting a signal from the first device operating in transmission mode to the second device operating in receiving mode.

* * * * *